United States Patent [19]

Orikasa et al.

[11] Patent Number: 4,864,418
[45] Date of Patent: Sep. 5, 1989

[54] DISPLAY UNIT FOR CONTROLLING PATTERN PRINTING

[75] Inventors: Teruo Orikasa, Tokyo; Sigeo Sumi, Saitama; Hiroshi Taguchi, Tokyo, all of Japan

[73] Assignee: Somar Corporation, Tokyo, Japan

[21] Appl. No.: 113,306

[22] Filed: Oct. 28, 1987

[51] Int. Cl.[4] .................. H04N 1/21; G03G 15/00
[52] U.S. Cl. .................... 358/296; 354/323; 354/5; 354/13
[58] Field of Search .............. 358/296, 302, 300; 354/323, 5, 13; 346/108; 901/47; 414/744 B; 400/178

[56] References Cited

U.S. PATENT DOCUMENTS

| | | |
|---|---|---|
| 4,329,027 | 5/1982 | Moyroud .................. 354/5 |
| 4,553,892 | 11/1985 | Huffman ................ 414/744 B |
| 4,613,942 | 9/1986 | Chen ...................... 901/47 |
| 4,760,458 | 7/1988 | Watanake ................ 358/296 |

Primary Examiner—E. A. Goldberg
Assistant Examiner—Mark Reinhart
Attorney, Agent, or Firm—Sughrue, Mion, Zinn, Macpeak & Seas

[57] ABSTRACT

A pattern printing device using a plurality of films. A robot arm suctions in the film from a stocker and includes a sensor to read film and operation data from the film. Such data can be displayed.

12 Claims, 9 Drawing Sheets

| CHA | b3 | * | b2 | * | b1 | * | b0 | * |
|-----|----|----|----|----|----|----|----|----|
| CHB | b3 | * | b2 | * | b1 | * | b0 | * |
| CHC | b3 | * | b2 | * | b1 | * | b0 | * |
| CHD | b3 | * | b2 | * | b1 | * | b0 | * |
| CHE | b3 | * | b2 | * | b1 | * | b0 | * |

DISPLAY UNIT FOR CONTROLLING PATTERN PRINTING

BACKGROUND OF THE INVENTION

1. Field of the Invention

The present invention relates to a pattern printing apparatus. More particularly, it relates to the art of pattern printing of systems such as a photoengraving process, to pattern printing for printed circuit boards, and to a block copy printing system.

2. Background of the Invention

The photoengraving process industry employs many kinds of small-lot production. With the widespread use of color scanners, various sorts of labor-saving machinery have been introduced. However, labor intensive techniques are still relied upon in the plate collection process.

As a result, there has been proposed a robot for making original negative plates by equipping a hand member with a data detection sensor for detecting the data of each of several marks which identify the contents of operation assigned to the pattern printing process. The data detection sensor would read data including identifying the kinds of films for use in printing a pattern and the contents of the operation. The robot would mechanically implement various sorts of operation by means of a controllng device such as a computer since the hand member would be not only rotatable but also transversely, vertically and longitudinally movable. The detailed description of the above described robot for negative plate making has already been given in Japanese Patent Application (OPI) No. 170916/83.

However, since no variable operational order setting mechanism is installed nor is a mechanism installed for displaying the operational order of the controlling device, for displaying the results of the pattern printing operation and for displaying an error message, a disadvantage is that it takes too much time to detect a portion experiencing difficulty during an alteration of the operational order or following a pattern printing error.

SUMMARY OF THE INVENTION

An object of the present invention is to provide a shortening of the time required for the alteration of operational order and the detection of a portion in trouble resulting from erroneous pattern printing. Concurrently sought is an improvement of the operability of pattern printing apparatus for making pattern printings through a photoengraving process, pattern printings on printed circuit boards, etc.

Another object of the present invention is to provide for variable setting of the operational order of a controlling device for a pattern printing apparatus for making pattern printings through the photoengraving process, pattern printings on printed circuit boards, etc.

Still another object of the present invention is to provide for the display of the results of pattern printing operation of a pattern printing apparatus for making pattern printings through the photoengraving process, pattern printings on printed circuit boards, etc.

A yet further object of the present invention is to provide for the display of the contents of the operation set by means of a group of lamps.

These and other objects, features and advantages of the invention will become more apparent upon a reading of the following description and accompanying drawings.

More specifically, a pattern printing apparatus according to the present invention comprises a plurality of films for printing a pattern. An identification mark is attached to each of the films. A data detection sensor detects data of each mark for identifying the contents of pattern printing operation. A controlling device controls steps in a pattern printing operation by means of the output of the sensor. Operational order setting means variably set the operational order of the controlling device. Display means display at least either the results of the pattern printing operation or an error message.

Furthermore, a group of display lamps display the contents of each type of operation set by the operational order setting means and read from the data represented by the identification marks used to identify the contents of the pattern printing operation.

In addition, the pattern printing apparatus includes a robot for pattern printing which is equipped with a hand member with a data detection sensor for detecting the data of each mark. The marks identify data of the contents of pattern printing operation and are used in the control of the pattern printing steps by means of the output of the sensor. The hand member is not only rotatable but also is movable transversely, vertically and longitudinally. Operational order setting means variably set and display the operational order of the controlling device. Display means display at least either the results of the pattern printing operation or an error message. The group of display lamps display the contents of each type of operation read from the data represented by the identification marks allotted to the plurality of films for pattern printing.

BRIEF DESCRIPTION OF THE DRAWINGS

FIGS. 3 through 7 are schematic views of a robot for manufacturing negatives according to the present invention.

FIG. 4 is a top view of the robot for manufacturing negatives.

DETAILED DESCRIPTION OF THE PREFERRED EMBODIMENTS

Referring now to an embodiment of the present invention applied to a negative manufacturing apparatus the present invention will be now described in specific terms.

In the accompanying drawings, like reference characters designate like and corresponding parts throughout and duplicate explanatory description of them will be omitted. In this description, the term "plate" is used interchangeably with the term "film" or "film sheet".

Figure 2:
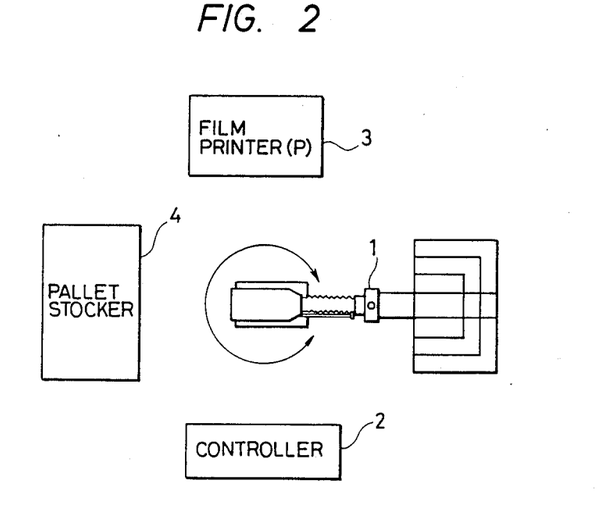
FIG. 2 is a diagram of a total system construction embodying the present invention.

FIG. 2 is a diagrammatic illustration of the construction of a total system embodying the present invention. The system comprises a robot 1 for manufacturing original print plates, a controlling device 2 including a computer, a film printer 3 and a pallet stocker 4. Most parts of this apparatus have been described in commonly assigned U.S. patent application, Ser. No. 728,619, filed Apr. 19, 1985 now abandoned.

Figure 3:
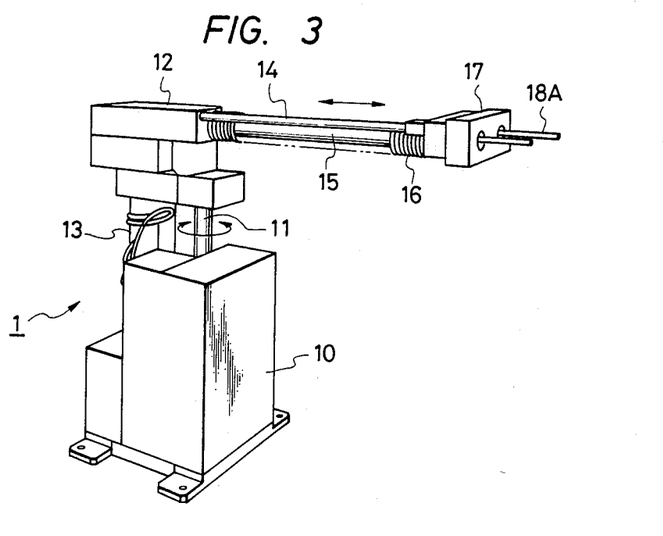
FIG. 3 is a perspective view of the robot.
Figure 4:
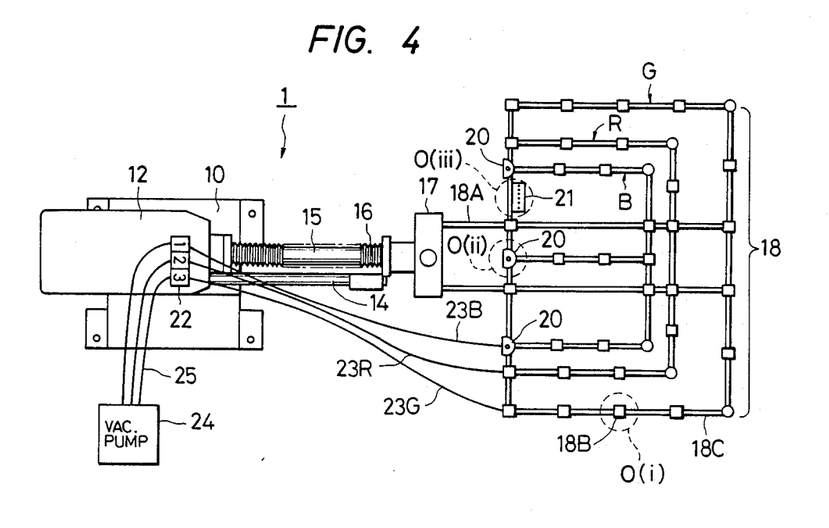

FIGS. 3 through 7 are schematic views of the construction of the aforesaid robot 1 for manufacturing negatives. FIG. 3 is a perspective view of a body of the robot 1. FIG. 4 is a top view of the robot 1. FIGS. 5A is a perspective view of the enlarged portion O(i) of FIG. 4 of a hand member and FIG. 5B is a sectional view taken on line A—A of FIG. 5A. FIGS. 6A is a perspective view of the enlarged portion O(ii) of FIG. 4 of the hand member and FIG. 6B is a sectional view taken on line B—B, of FIG. 6A. FIGS. 7A and 7B are perspective and top views of the enlarged portion O(iii) of FIG. 4 of the hand member.

As shown in FIGS. 3 and 4, the robot 1 comprises a support 11 rotatably mounted onto a frame 10. An arm support member 12 is fitted to the upper end of the support 11. A motor 13 is used to rotate the support 11. A piston rod 14 and an arm 15 are coupled to the arm support member 12. In this case, a screw mechanism is used to movably support the arm 15 in the longitudinal direction with the arm support member 12. The robot 1 also includes a bellows-like cover 16 for protecting the arm 14 and improving its external appearance. A coupling member 17 couples the arm 15 and a hand member 18 as will be described later. The coupling member 17 supports the hand member 18 in such a manner as to allow it to move in the vertical direction. In the coupling member 17 is contained a driving mechanism (not shown) for vertically moving the hand member 18. As shown in FIG. 4, the hand member 18 is so arranged that suction pipes 18C made of aluminum or fiber reinforced plastics is coupled to hand support pipes 18A made of similar material through joints 18B. The coupling member 17 is used to support the hand support pipes 18A movably in the vertical direction at the end of the arm 15. Thereby a plurality of rectangular areas labeled blue (B), red (R) and green (G) are formed.

Figures 5A, 5B, 6A, 6B:
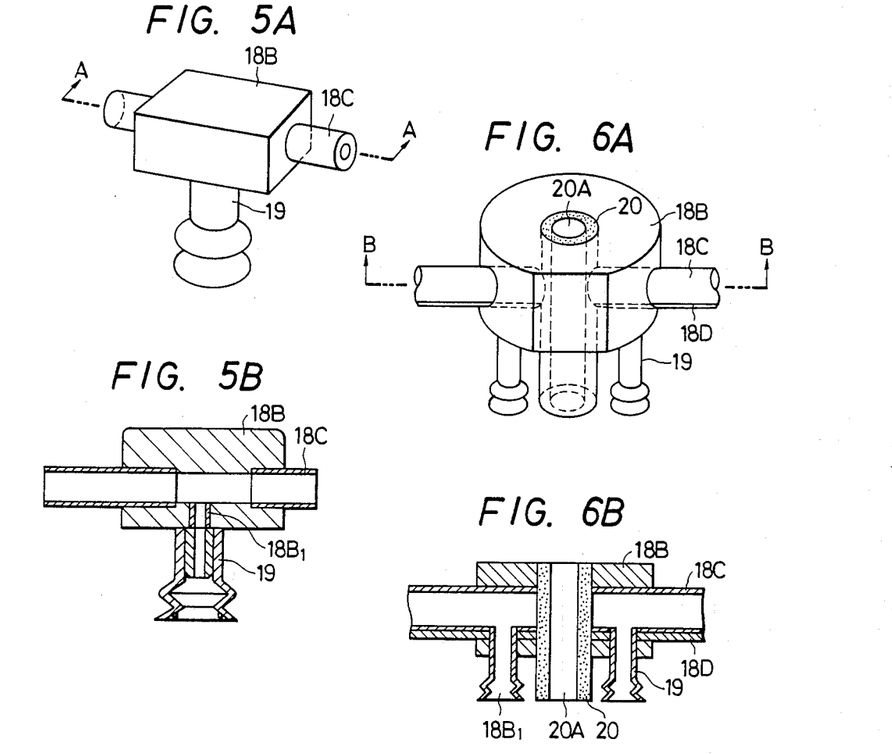
FIGS. 5a and 5B include a perspective view of the detailed enlarged construction of the hand member portion encircled by O(i) and the sectional view thereof taken on line A—A.
FIGS. 6a and 6b include a perspective view of the detailed enlarged construction of the hand member portion encircled by O(ii) and the sectional view thereof taken on line B—B.

As shown in FIGS. 5A and 5B, each joint 18B is provided with adsorption pads 19 fitted to the joint 18B through ventilating holes $18B_1$ which are connected to the central passage of the suction 18C. As shown in FIGS. 6A and 6B, there are provided in several of the joints 18B a film press member 20 having a fitting portion 20A into which positioning pin (not shown) is fitted. Several adsorption pads 19 are placed close to the film press member 20 and are connected to the central passages to suction pipes 18C the ventilating holes $18B_1$. A reinforcing frame 18D such as aluminum frame supports the pipes 18C and a data detection sensor 21. The shape of the adsorption pads 19 placed close to the film press member 20 is such that they encircle the film press member 20 or a single adsorption pad 19 is semicircular. The material for the joint 18B is composed of fiber reinforced plastics.

Figure 7A:
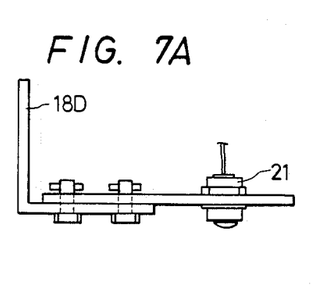
FIGS. 7a and 7b include a perspective view of the detailed enlarged construction of the hand member portion encircled by O(iii) and the top view thereof.
Figure 7B:
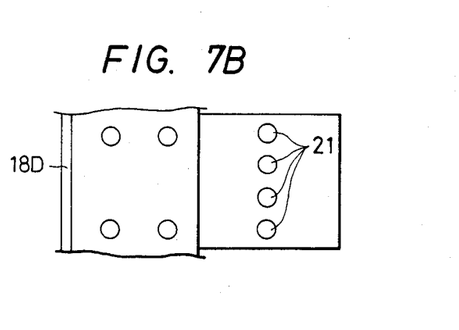

As shown in FIGS. 7A and 7B, the data detection sensor 21 is designed to read out the kinds of films and each mark for identifying the contents of the operation as described later. The mark is attached to each of the films for manufacturing negatives. The data detection sensor 21 is, for instance, fitted to a predetermined position of the reinforcing frame 18D of the hand member 1. A fiber sensor, video camera, magnetic head, charge coupled device (CCD) or the like may be used as a data detection sensor.

In a vacuum transfer device 22 (FIG. 4), the pipe 18C in the blue (B) area for A3 size paper is evacuated when, for instance, only a valve (1) is opened and the adsorption pads 19 in that area become effective When the valves (1) and (2) are opened, the suction pipes 18C in the blue (B) and red (R) areas for B3 size paper and for A2 size paper are evacuated and the corresponding adsorption pads 19 become effective. When all of the valves (1), (2), and (3) are opened, the suction pips 18C in the blue (B), and red (R) and green (G) areas for B2 size paper are evacuated. In other words, as shown in FIG. 4, the suction pipes 18C of the hand member 18 are hollow and the hollow path is divided into three routes: blue (B), red (R) and green (G). Moreover, air distribution pipes 23B, 23R, 23G are connected to the aforesaid routes and to the three valves (1), (2), (3) of the vacuum transfer device 22, respectively. The other ends of the valves (1), (2), (3) of the vacuum transfer device 22 are connected to an air aspirator 24 such as a vacuum pump through air distribution pipes 25.

The absorption and separation of the absorption pads 19 fitted to the hand member 18 are thus controlled.

Figure 8:
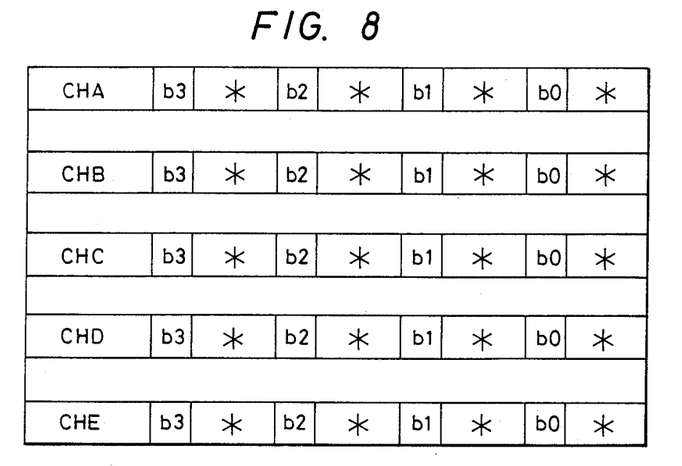
FIG. 8 is a top view of a mark for identifying the kinds of films and the contents of operation.

FIG. 8 shows an arrangement of marks for identifying the kinds of films and the contents of operation embodying the preset invention, wherein $CH_A$ through $CH_E$ represent channels, whereas $b_0$ through $b_3$ designate bits of each of the channels. More specifically, * indicates the presence of a signal, i.e., when the signal is 1 at the time of preparing the mark for identifying the contents of this operation, this portion is totally black. When no positive signal exists, i.e., the signal is 0, this portion is left blank.

The kinds of films and the marks for identifying the contents of operation shown in FIG. 8 are read out by the data detection sensor 21 and, assuming the signal supplied to the controlling device 2 of the robot has 4 bits ($b_3$, $b_2$, $b_1$, $b_0$), an operation is conducted on the basis of the corresponding kinds of films and the contents of the operation, e.g., when a multiplex printer is used to perform the operation. In other words, the printer operates after selecting the contents of the operation in each step shown below. For the different kinds of films, if an operation is labeled 1, as the corresponding bit is covered with black.

[A] The identification of a plate is made by the channel $CH_A$. Table 1 shows the relation between the plate and an input signal.

TABLE 1

| Plate name: | CH$_A$ | | | |
|---|---|---|---|---|
| | b$_3$ | b$_2$ | b$_1$ | b$_0$ |
| Mask plate | 1 | 0 | 0 | 1 |
| Embracing plate | 1 | 0 | 1 | 0 |
| Attachment plate | 1 | 0 | 1 | 1 |
| Character plate | 1 | 1 | 0 | 0 |
| Raw stock (fresh film) | 1 | 1 | 0 | 1 |

However, a value 1 for bit b$_3$ is assumed as an input for starting reading out the signal.

[B] If a mask plate has been indicated, then the four channels of input signal from the mask plate are:

| | b$_3$ | b$_2$ | b$_1$ | b$_0$ | |
|---|---|---|---|---|---|
| CH$_A$ | 1 | 0 | 0 | 1 | - mask plate |
| CH$_B$ | * | * | * | * | - data on the number of colors and the combinations of colors. |
| CH$_C$ | * | * | * | * | - data on the embracing plate and whether or not the operation is to be continued. |
| CH$_D$ | 0 | * | * | * | - film size data |

However, a value of either 0 or 1 is entered for *.

[B1] The channel CH$_B$ designates the number of colors and the combinations of respective colors Y, M, C, BL corresponding to the mask.

| | b$_3$ | b$_2$ | b$_1$ | b$_0$ |
|---|---|---|---|---|
| Y Plate | 1 | 0 | 0 | 0 |
| M Plate | 0 | 1 | 0 | 0 |
| C Plate | 0 | 0 | 1 | 0 |
| BL Plate | 0 | 0 | 0 | 1 |

However, the combination of colors is represented by the combination of the 4 bits arranged in the order: Y=yellow; M=magenta; C=cyan; and BL=black.
For instance,
in the case of Y and M plates, 1100;
in the case of Y and C plates, 1010;
in the case of Y and BL plates, 1001;
in the case of M and C plates, 0110.

[B2] The channel CH$_C$ indicates the presence or absence of the embracing plates and whether or not the operation is to be continued.

| | b$_3$ | b$_2$ | b$_1$ | b$_0$ |
|---|---|---|---|---|
| embracing plate 1 | * | 0 | 0 | 1 |
| embracing plate 2 | * | 0 | 1 | 0 |
| embracing plate 1 and 2 | * | 0 | 1 | 1 |
| no embracing plate | * | 1 | 0 | 0 |

Furthermore, a 0 is entered in b$_3$ when the operation is to be continued and a 1 is entered when the last mask plate is used.

[B3] The channel CH$_D$, in the case of the mask plate designates the film size according to the following convention.

| | b$_3$ | b$_2$ | b$_1$ | b$_0$ |
|---|---|---|---|---|
| A3 size plate | 0 | 0 | 0 | 1 |
| B3 size plate | 0 | 0 | 1 | 0 |
| A2 size plate | 0 | 0 | 1 | 1 |
| B2 size plate | 0 | 1 | 1 | 0 |

[C] signal from the embracing plate. If an embracing plate has been indicated, then the four channels of input signal from the embracing plate are:

| | b$_3$ | b$_2$ | b$_1$ | b$_0$ |
|---|---|---|---|---|
| CH$_A$ | 1 | 0 | 1 | 0 |
| CH$_B$ | 0 | * | * | * |
| CH$_C$ | 1 | * | * | * |

[C1] The channel CH$_B$, in the case of an embracing plate, designates the number of the embacing plate and the occurrence of temporary storage.

| | b$_3$ | b$_2$ | b$_1$ | b$_0$ |
|---|---|---|---|---|
| embracing plate 1 | 0 | * | 0 | 1 |
| embracing plate 2 | 0 | * | 1 | 0 |

However, a 0 is entered in the bit b$_2$ at the time of discharge, whereas a 1 is entered at the time of temporary storage.

[C2] The channel CH$_C$, in the case of the embracing plate, designates the number of masks for use at the time of reuse.

| | b$_3$ | b$_2$ | b$_1$ | b$_0$ | |
|---|---|---|---|---|---|
| 1st one | 1 | 0 | 0 | 1 | ... only plate involved |
| 2nd one | 1 | 0 | 1 | 0 | ... next plate |
| 3rd one | 1 | 0 | 1 | 1 | |
| 4th one | 1 | 1 | 0 | 0 | |
| 5th one | 1 | 1 | 0 | 1 | |
| 6th one | 1 | 1 | 1 | 0 | |
| 7th one | 1 | 1 | 1 | 1 | |

[D] Input signal from the attachement plate. If an attachment plate has been indicated, then the four channels of input signal from the attachment plate are:

| | b$_3$ | b$_2$ | b$_1$ | b$_0$ |
|---|---|---|---|---|
| CH$_A$ | 1 | 0 | 1 | 1 |
| CH$_B$ | * | * | * | * |
| CH$_C$ | 1 | * | * | * |
| CH$_D$ | 0 | * | * | * |

[D1] The channel CH$_B$, in this case of the attachment plate, designates the color classification of the attachment plates.

| | b$_3$ | b$_2$ | b$_1$ | b$_0$ |
|---|---|---|---|---|
| Y Plate | 1 | 0 | 0 | 0 |
| M Plate | 0 | 1 | 0 | 0 |
| C Plate | 0 | 0 | 1 | 0 |
| BL Plate | 0 | 0 | 0 | 0 |

[D2] The channel CH$_C$, in this case of the attachment plate, designates the mask plate number corresponding to the attachment plates.

| b$_3$ | b$_2$ | b$_1$ | b$_0$ | |
|---|---|---|---|---|
| 1 | 0 | 0 | 0 | ... no corresponding mask plate |
| 1 | 0 | 0 | 1 | ... corresponding mask: No. 1 |
| 1 | 0 | 1 | 0 | ... corresponding mask: No. 2 |
| 1 | 0 | 1 | 1 | ... corresponding mask: No. 3 |
| 1 | 1 | 0 | 0 | ... corresponding mask: No. 4 |
| 1 | 1 | 0 | 1 | ... corresponding mask: No. 5 |

| $b_3$ | $b_2$ | $b_1$ | $b_0$ | |
|---|---|---|---|---|
| 1 | 1 | 1 | 0 | ... corresponding mask: No. 6 |
| 1 | 1 | 1 | 1 | ... corresponding mask No. 7 |

[D3] the channel $CH_D$, in this case of the attachment plate, designates the exposure.

| $b_3$ | $b_2$ | $b_1$ | $b_0$ | |
|---|---|---|---|---|
| 0 | 0 | 0 | 1 | ... exposure 1 |
| 0 | 0 | 1 | 0 | ... exposure 2 |
| 0 | 1 | 0 | 0 | ... exposure 3 |

[E] If a character plate has been indicated, then the four channels of input information from the character plate are:

| | $b_3$ | $b_2$ | $b_1$ | $b_0$ |
|---|---|---|---|---|
| $CH_A$ | 1 | 1 | 0 | 0 |
| $CH_B$ | * | * | * | * |
| $CH_C$ | 1 | * | 0 | 0 |
| $CH_D$ | 0 | * | * | * |

[E1] The channel $CH_B$ designates the color classification of the letter or character plate.

| | $b_3$ | $b_2$ | $b_1$ | $b_0$ |
|---|---|---|---|---|
| Y Plate | 1 | 0 | 0 | 0 |
| M Plate | 0 | 1 | 0 | 0 |
| C Plate | 0 | 0 | 1 | 0 |
| BL Plate | 0 | 0 | 0 | 1 |

[E2] The channel $CH_D$ designates the continuation or termination of the operation.

| $b_3$ | $b_2$ | $b_1$ | $b_0$ | |
|---|---|---|---|---|
| 1 | 0 | 0 | 0 | ... continuation of operation |
| 0 | 1 | 0 | 0 | ... termination of operation |

[E3] The channel $CH_D$ designates exposure.

| $b_3$ | $b_2$ | $b_1$ | $b_0$ | |
|---|---|---|---|---|
| 0 | 0 | 0 | 1 | ... exposure 1 |
| 0 | 0 | 1 | 0 | ... exposure 2 |
| 0 | 1 | 0 | 0 | ... exposure 3 |

[F] If a fresh film has been indicated, then the three channels of input signal from the fresh film are:

| | $b_3$ | $b_2$ | $b_1$ | $b_0$ |
|---|---|---|---|---|
| $CH_A$ | 1 | 1 | 0 | 1 |
| $CA_B$ | * | * | * | * |
| $CH_C$ | 0 | * | * | * |

[F1] The channel $CH_B$, in the case of fresh film, designates the color classification of the raw stock.

| | $b_3$ | $b_2$ | $b_1$ | $b_0$ |
|---|---|---|---|---|
| Y Plate | 1 | 0 | 0 | 0 |
| M Plate | 0 | 1 | 0 | 0 |
| C Plate | 0 | 0 | 1 | 0 |
| BL Plate | 0 | 0 | 0 | 1 |

[F2] The channel $CH_C$ designates the size of the raw stock.

The input signal is the same as that of [C].

The aforesaid pallet stocker 4 is composed of 16 shelves of pallets, divided into four groups, each having four shelves. Each group is so arranged as to finish a complete pattern for a printing. For instance, the first shelf (a) is used as a shelf for receiving originals; the second shelf (b) is used as another shelf for receiving and simultaneously temporarily storing unexposed films; the third shelf (c) is used as still another shelf for temporary storage; and the fourth shelf (d) is used as still another shelf for discharging. Accordingly, the hand member 18 of the aforesaid robot is placed in such a position as to pick up a proper film.

Figure 9:
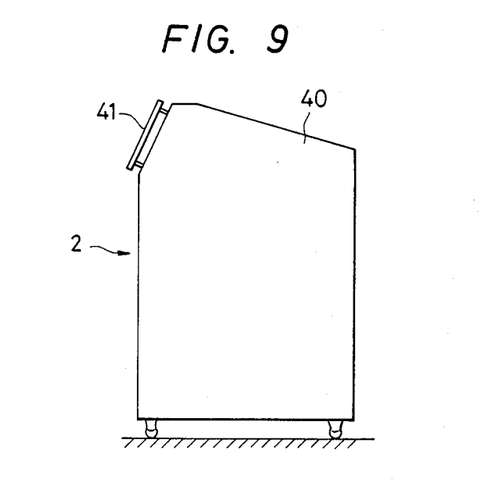
FIG. 9 is a side view of a controlling device.

As shown in FIG. 9, the controlling device 2 has a control display panel 41 on the front face of 9 cabinet 40.

Figure 1:
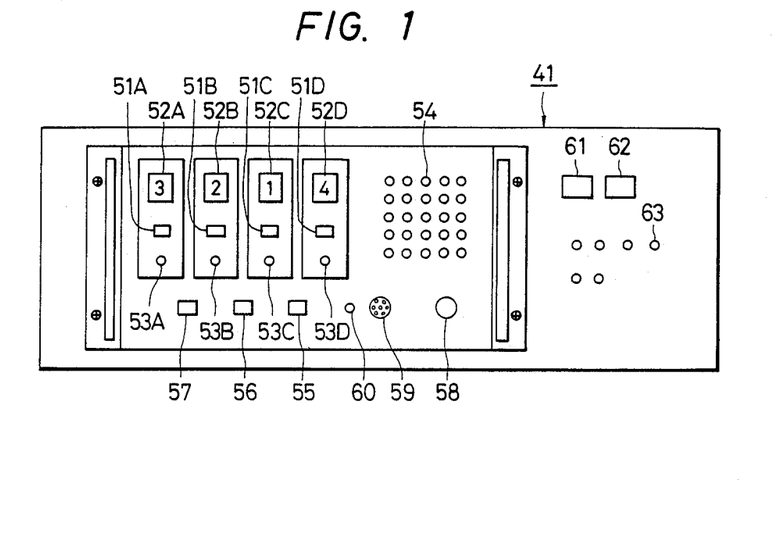
FIG. 1 is a top view of a layout of a control display panel embodying the present invention.

FIG. 1 is a front view representative of the layout of the control display panel. In FIG. 1, there are shown operational order setting means 51A, 51B, 51C, 51D for setting operational numbers in order when a switch is turned on. Each of corresponding displays 52A, 52B, 52C, 52D displays either the operational order number set by each of the operational order setting means 51A through 51D or an error message. When the operational order setting means 51A through 51D are turned on, the numbers are displayed in the energized order. When this operation is completed, each number displayed is changed to 0. Moreover, when erroneous pattern printing occurs, the number displayed in order is erased and an error indicator is displayed instead. Reset switches 53A, 53B, 53C, 53D are used to reset the operational order setting means 51A through 51D.

A group of display lamps 54 are used to display the various kinds of operation after reading the kinds of films and the contents of operation from the identification marks. When the mark of the operational contents is set in error, any lamp point representing the error flashes. The control display panel also includes an operation start switch 55, an operation interruption switch 56, an emergency stop switch 58, a trouble occurrence buzzer 59, a release switch 60 for the trouble occurrence buzzer 59, an automatic setting switch 61, a normal operation setting switch 32, and a pallet manual operation switch 63.

Figure 10:
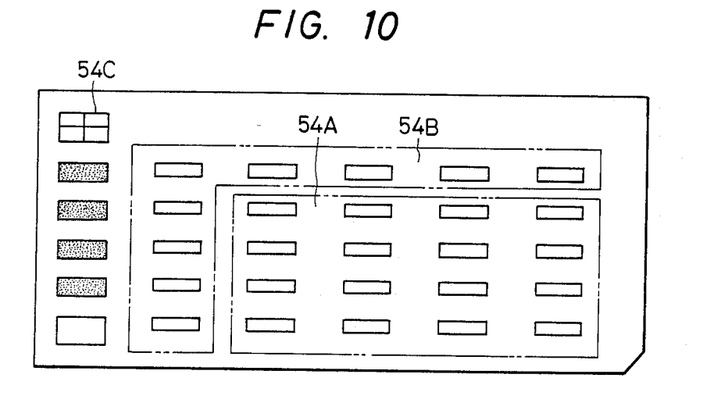
FIG. 10 is a top view of a mark sheet for displaying the contents of set operation according to the present invention.

A mark sheet displaying the contents of an operation is arranged as shown in FIG. 10. In this mark sheet, a check sum mark section 54B for preventing erroneous mark setting is provided on the peripheries of a contents mark section 54A for indicating the contents of operation. In this case, when the vertical or horizontal sum of the contents mark section 54A is an even number, proper setting is assumed and the corresponding portion of the check sum mark section 54B is left blank. On the other hand, when the vertical or horizontal sum is an odd number, erroneous setting is assumed and there is used a mark sheet whose check sum mark section 54B has the corresponding portion totally marked black, which is read out by the display sensor. The control display panel 41 further includes a check mark (with, e.g., a Greek cross) for indicating the operation the data detection of sensor.

The operation of display means of the controlling device will subsequently be described.

In FIG. 1, the operational order is set by the operational order setting means 51A through 51D, whereby the operation order numbers thus set are displayed on the displays 52A through 52D. If an error exists in the operational order thus displayed, the reset switches 53A through 53D are reset.

On the termination of the setting of the aforesaid operation order, the start switch 55 is turned on and operation as described later is started. While the stop switch 57 is held on, the operation is terminated in the normal course and stopped.

The operation of each part will be described.

(1) When the interruption switch is turned on:

The operation is stopped at the reset step and any given operation can be started by turning on the start switch.

(2) When the error code is displayed:

(a) At the time of an error code $EON_1N_2$, a buzzer release switch 60 is turned on because of a hard error and a hard check is carried out using the error code.

(b) At the time of an error code $EN_1N_2N_3$, the buzzer release switch 60 is turned on because of erroneous mark reading data and the operation is forced to stop by the stop switch 57.

Subsequently, a description will be given of the error code.

The first character "E" of the error code $EN_1N_2N_3$ designates an error and the digit of the first $N_1$ represents an error relevant to the controlling device 2 such as a computer. For instance, the definition is given as follows:

Error Code: Contents of display:

$EON_2N_3$ Waiting for a signal of the completion of each step.

$E1N_2N_3$ Bit pattern error or original bit miss.

$E2N_2N_3$ Error relating to raw stock processing.

$E3N_2N_3$ Error relating to discharge processing.

$E4N_2N_3$ Error relating to plate or charge stock processing.

$E5N_2N_3$ Error relating to character plate.

Subsequently, the two digits of the second and third variable digits $N_2N_3$ designate various kinds of errors. For instance, the following definition will be given:

Order: Error code: Contents of display:

1. E010 Waiting for a signal of the completion of moving the arm to the printer.
    Robot operation 1.
2. E011 Waiting for a signal of the completion of transfer to mark reading start position.
    Robot operation 2.
3. E012 Waiting for a signal of the completion of mark reading.
    Robot operation 3.
4. E013 waiting for a signal of the completion of film adsorption.
    Robot operation 4.
5. E014 Waiting for a signal of the completion of film setting.
    Robot operation 5.
6. E015 Waiting for a signal of the completion of moving the arm to the pallet.
    Robot operation 6.
7. E016 Waiting for a signal of the completion of elevation of the hand because of mark reading miss.
    Robot operation 7
8. E020 Waiting for a signal of the completion of the shelf hook pin shrinkage point.
9. E021 Waiting for a signal of the completion of the shelf hook pin extension point.
10. E004 Irregularity of the hook pin.
11. E005 Drop point of the pallet or pallet.
12. 
13. E101 Film size or mask number error relating to the mask plate.
14. E102 Film size or exposure error relating to the character plate.
15. E103 Color classification data or exposure error relating to the embracing plate.
16. E104 Film setting miss (operator miss)
17. E200 Film setting miss.
18. E201 Color classification error (relating to the plate) of raw stock.
19. E202 Film size error (relating to the plate) of fresh film.
20. E203 Lack of fresh film (relating to the character plate) applicable to the character plate.
21. E204 Film size error (relating to the character plate) of fresh film.
22. E301 Inconsistency in the number of discharged mask plates with the number of those on the printer.
23. E302 ditto
24. E303 ditto
25. E304 ditto
26. E305 ditto
27. E306 ditto
28. E307 ditto
29. E308 ditto
30. E309 ditto
31. E310 ditto
32. E311 ditto
33. E315 ditto
34. E316 ditto
35. E317 ditto
36. E318 ditto
37. E319 Inconsistency in the number of discharged mask plates with the number of plates on the printer.
38. E320 ditto
39. E321 ditto
40. E322 ditto
41. E324 ditto
42. E312 Discharged mask plate entry miss.
43. E400 Film setting miss.
44. E401 Mask plate number error against the plates 1, 2.
45. E402 Appropriation error of the mask plate between the plate and the mask plate
46. E403 Mask plate number error against the plate.
47. E405 Appropriation error of the plate.
48. E406 Presence or absence error of the plate.
49. E407 Production of more than one plate.
50. E501 Film size or exposure error of the character plate.

The error message display will now be described.

Figure 11:
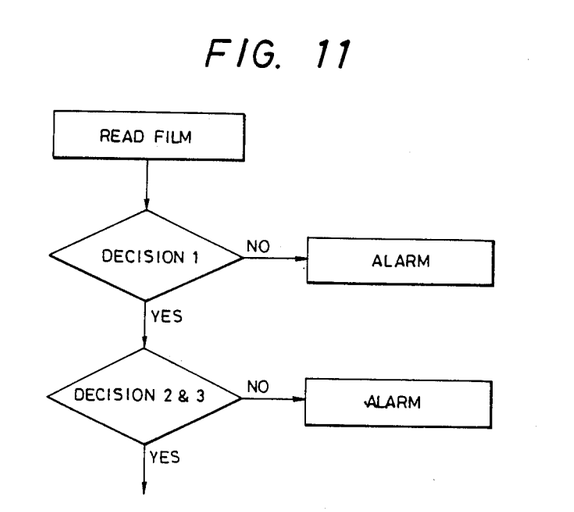
FIG. 11 is a flowchart for explaining the error message display operation.

When the data for identifying the kinds of films is read, the following three decisions are made in the controlling device 2 in accordance with a flow chart shown in FIG. 11.

Descision 1 a decision is made regarding whether or not a signal of the completion of operation has been returned from each hardware section to the controlling device. If the completion signal has been thus returned, the YES route is followed and, if not, the NO route is followed.

Decision 2 a decision is made regarding whether the number of vertical or horizontal portions totally colored black in the mark sheet is even or odd. When it is an even number, the YES route is followed and, if an odd number, the NO route is followed.

Decision 3 a decision is made regarding whether or not the theoretical contents of the operation of the mark sheet is contrary to the actual operation. If the result is not contrary, the YES route is followed and, if it is contrary, the NO route is followed.

When the result of any of the aforesaid decisions is a NO, an alarm process is implemented.

Concrete examples of the decision 2 are as follows:

Mask setting is taken as an example.

In FIGS. 12 through 16, the mark ""0" designates one out of the group of display lamps 54 which flashes, whereas the mark "+" indicates wrong data.

Figure 12:
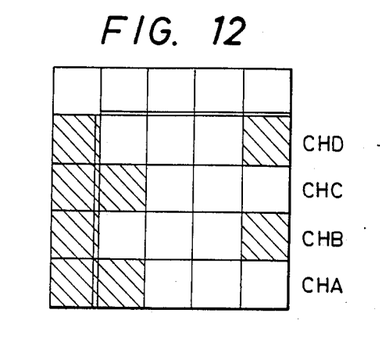
FIGS. 12 through 16 are typical diagrams for explaining a decision 2 of FIG. 11.

(1) An example of a correctly marked mark sheet is shown in FIG. 12.

Figure 13:
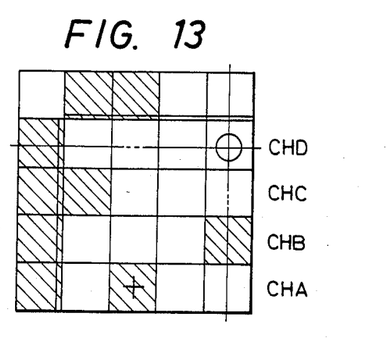

(2) When there is an omission of a mark and wrong data such as shown in FIG. 13, the applicable error code is E104. The one of the group of display lamps 54 which corresponds to the portion with the omission of the mark flashes as determined by the two dimensional check sum.

Figure 14:
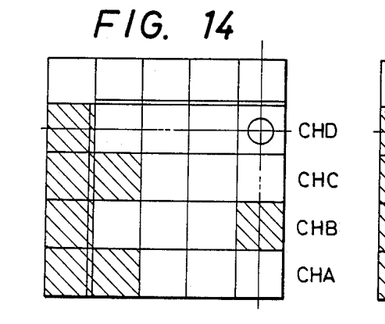

(3) When there is only the omission of the mark, as shown in FIG. 14, the applicable error code is E101. The one of the group of display lamps 54 which corresponds to the portion with the omission of the mark comes on and off.

Figure 15:
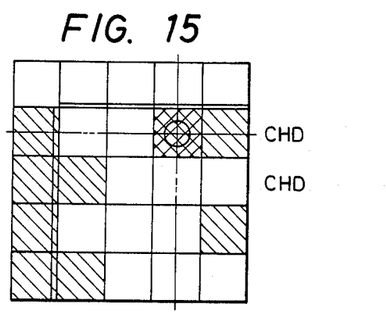

(4) When dust settles on the mark sheet, so as to produce an extra mark as shown in FIG. 15, the applicable error code is E101. The one of the group of display lamps 54, which corresponds to the portion with the dust flashes.

Figure 16:
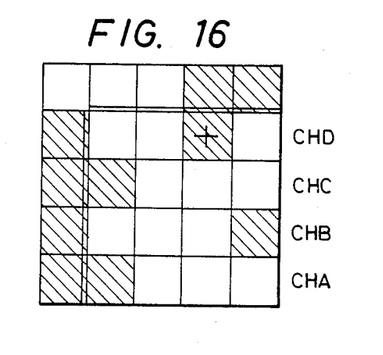
Figure 17:
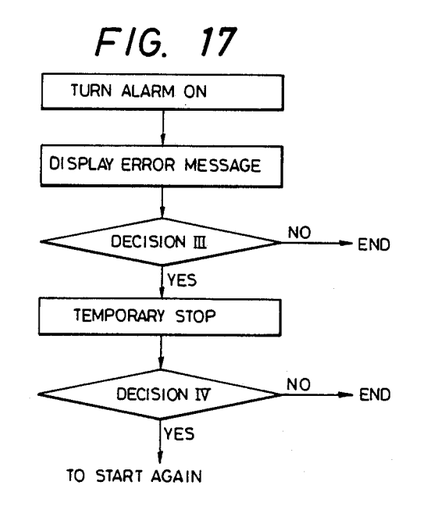
FIG. 17 is a flowchart for explaining alarm processing.

(5) When a wrong mark is attached as shown in FIG. 16, none of the display lamps 54 are actuated. Only the error message is used to display the error at that time.

Subsequently, the alarm process will be described.

When the alarm process is required, an error display is made on the display involved in the pertinent operation among the displays 52A through 52D. If a YES results from both the decisions 1 and 2 in FIG. 11, the error corresponds to error messages to E0NN or E1NN and thereby the interruption switch is turned on. If a NO results either of these decisions, the process is terminated (END). In the case of both YES results above, the previously described said decision is made and, if the result of decision 3 is YES, it proves that the error E0NN and E1NN have been eliminated and the operation is restarted. In the case of a NO result in decision 3, the process is terminated (END).

The operation of multiplex printing in the present embodiment will be described.

Figure 18A:
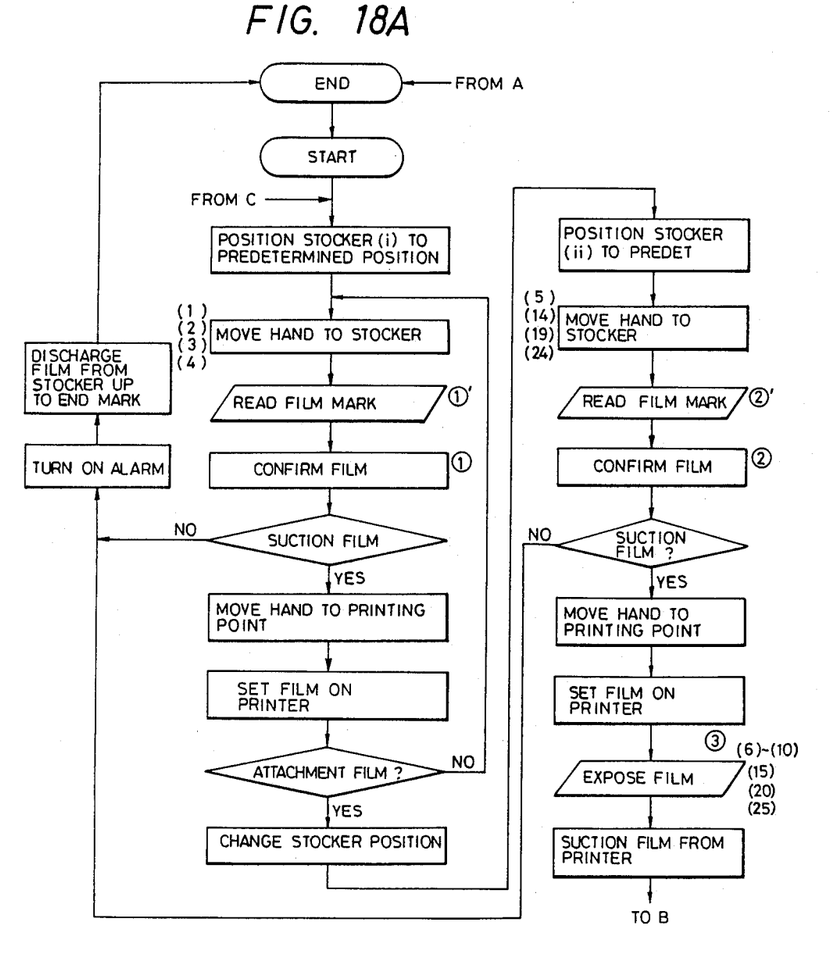
FIGS. 18a and 18b are a flowchart for explaining the operating of the embodiment of the present invention.
Figure 18B:
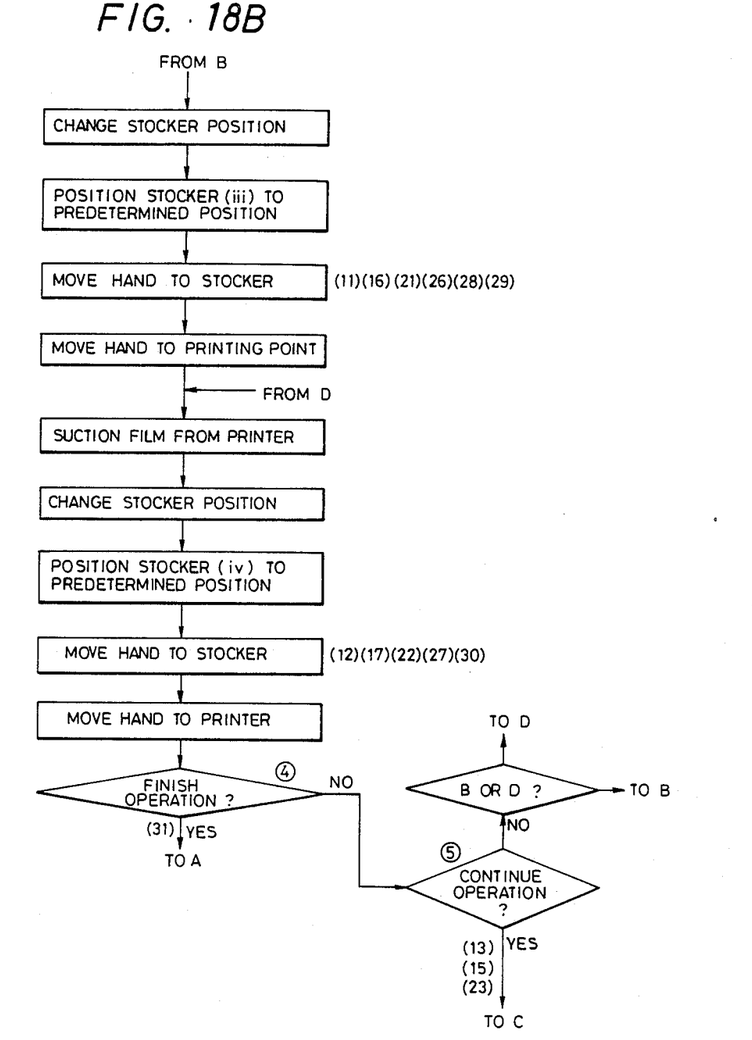

FIGS. 18(A) and 18(B) illustrate flowcharts of the operations embodying the present invention. In these flowcharts, the numerals 1 through 6 enclosed in circles indicate the order of confirmation and encircled numerals 2' through 5' designate the order in which data is written to the controlling device 2. Moreover, numerical order 1 through 31 of various types of operations as described later are repeatedly attached to the corresponding portions in the flowcharts of FIGS. 18A through 18C. The operation of multiplex printing is intended to repeatedly expose unexposed films to photographs, illustrations, characters, ruled lines, etc. in conformity with a layout for finishing printed matter.

Figure 19:
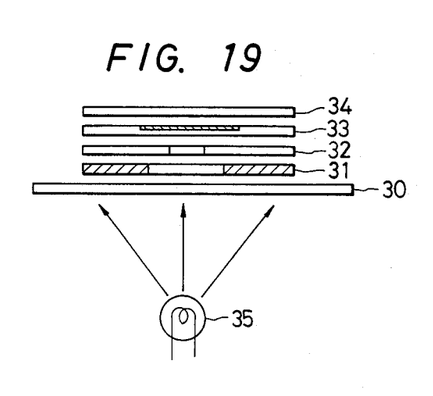
FIG. 19 is a diagram for explaining the operation of the aforesaid embodiment of the present invention.

Accordingly, originals required for the exposure include masking films for masking unnecessary portions in view of the layout in addition to original films of photographs, illustrations, characters, ruled lines and the like. Those originals differ in quantity from one another depending on the item of printed matter and consequently the order in which the originals and the unexposed films are adhesive-bonded by kinds at the time of exposure has been predetermined in view of their properties. As shown in FIG. 19, for instance, a mask or character plate 31 is first set on top of a printer glass 30 with an attachment plate 32, a plate 33 and unexposed fresh film 34 being superposed in order.

Up to four sheets of unexposed film 34 per mask plate 31 are changed and exposed. However, because the mask plate 31 is set closest to the surface of the printer glass 30, up to four sheets of the films are exposed and discharged.

Accordingly, data of the kinds of film superposed on the mask plate 31 can be obtained almost completely from the mask plate 31.

The aforesaid embracing plate 32 is set on the mask plate 31. However, as the embracing plate 32 may become unnecessary in view of the layout of printing material or only one plate may be required to deal with a plurality of mask plates 31, it may be stored temporarily. Moreover, a plurality of embracing plates 32 may be piled up for the purpose.

The aforesaid attachment plate 33 is set in direct contact with the unexposed film 35. That is, it is set on the embracing plate 32 or, if no embracing plate 32 is arranged, on the mask plate 31. In this case, the atatchment plate 33 is discharged once the unexposed film 34 is exposed thereto.

As set forth above, provided the mark for identifying the kinds of films and the contents of operation is attached onto each film and loaded with the following data, the data detection sensor 21 fitted to the hand member 18 of the robot can read out the data, whereby the robot in place of the operator allows multiplex printing operation to be accomplished in accordance with the flowchart shown in FIG. 18.

More specifically, the following operation is carried out in accordance with the flowchart shown in FIGS. 18(A) through 18(B).

(1) Mask plate, character plate (group A)

(i) Whether or not the next mask plate exists (continuation of operation).

(ii) Number of attachment plates corresponding to the next mask plate (number of colors).

(iii) Whether or not the embracing plate corresponding to the next mask plate and the number of them.

(iv) Designation of film size.

(2) Embracing plate (group C)

(i) Number of embracing plates and the necessity of discharging or temporarily storing them.

(ii) Corresponding mask plate number when the embracing plate is reused after it has been stored, temporarily.

(3) Attachment plate (group B)

(i) Corresponding mask plate number.

(ii) Data of the attachment plate by colors.

(iii) Designation of exposure.

The following description if referenced with the numerical order (1) through (31).

Operation AO

A film is transferred from the shelf of the pallet stocker (simply called the stocker) onto the printer.

(1) A mask plate is taken out of the stocker (i) and placed on the (glass) surface of the printer.

(2) An embracing plate is taken out of the stocker (i) and placed on the mask plate 1.

(3) Another embracing plate 2 is taken out of the stocker (i) and placed on the embracing plate 1.

(4) An attachment plate Y is taken out of the stocker (i) and placed on the embracing plate 2.

(5) A sheet of fresh film Y is taken out of the stocker (ii) and placed on the attachment plate Y.

Operation B

Film Exposure (6) Film is covered with a blanket.

(7) Vacuum pump actuated to draw a vacuum.

(8) Light source flashes.

(9) The vacuum pump is stopped to operate and the vacuum condition is released.

(10) The blanket is removed.

A film is transferred from the shelf of the pallet stocker (simply called the stocker) onto the printer.

Operation C1

(11) A fresh film Y is loaded from the printer surface to a stocker (iii).

(12) An attachment plate 1Y is discharged from the printer surface to a stocker (iv).

Operation A1

A film is transferred from the stocker shelf onto the printer.

(13) An attachment plate M is taken out of the shelf (i) of the stocker and placed on the embracing plate 2.

(14) A fresh film M plate is taken out of the shelf (ii) of the stocker and placed on the attachment plate M.

(15) The operation B [(6)–(10)] is conducted.

Operation C1

The film is transferred from the printer to the shelf of the stocker (iii).

(16) The fresh film M plate is taken from the surface of the printer and contained in the stocker shelf (iii) of the stocker.

(17) The attachment plate M is taken from the surface of the printer and discharged into the (discharge) shelf (iv) of the stocker

Operation A1

A film is transferred from the stocker shelf onto the printer.

(18) An attachment plate 1C is taken out of the shelf (i) of the stocker and placed on the embracing plate 2.

(19) A fresh film C plate is taken out of the shelf (ii) of the stocker and placed on the attachment plate C.

(20) The operation B [(6)–(10)] is conducted.

Operation C1

The film is transferred from the printer to the shelf of the stocker.

(21) The fresh film C plate is taken from the surface of the printer and contained in the shelf (iii) of the stocker.

(22) The attachment plate 1C is taken from the surface of the printer and discharged into the (discharge) shelf (iv) of the stocker.

Operation A1

A film is transferred from the stocker shelf onto the printer.

(23) An attachment plate BL is taken out of the shelf (i) of the stocker and placed on the embracing plate 2.

(24) A fresh film BL plate is taken out of the shelf (ii) of the stocker and placed on the attachment plate BL.

(25) the operation B [(6) - (10)] is conducted.

Operation CO

The film is transferred from the printer to the shelf of the stocker.

(26) The fresh film BL plate is taken from the surface of the printer and contained in the shelf (iii) of the stocker.

(27) The attachment plate BL is taken from the surface of the printer and discharged into the (discharge) shelf (ii) of the stocker.

(28) The embracing plate 2 is taken from the surface of the printer and contained in the shelf (iii) of the stocker.

(29) The embracing plate 1 is taken from the surface of the printer and contained in the shelf (ii) of the stocker.

(30) The mask plate is taken from the surface of the printer and discharged into the (discharge) shelf (ii) of the stocker.

(31) Termination of the operation

As set forth above, the following effects are attainable from the aforesaid embodiments.

(1) The operator is required only to mount a group of films as originals onto the pallet stocker and press the start switch for instructing operation and the robot is automatically operated so as to effect the operation without other types of mechanical operation, whereby the whole pattern printing step can be automated completely.

(2) The mark for identifying the kinds of films and the contents of operation is attached to each film and the hand member of the robot is equipped with the data detection sensor, which is so operated as to supply the data to the controlling device, so that various kinds of operation are automatically performed.

(3) The installation of the operational order setting means makes it possible to change the operational order easily at any time by turning on the press button.

(4) The installation of the displays for displaying the operational order and the error message also makes it possible to confirm the operation order at a glance.

(5) Because of the displays referred to in (4), any portion in trouble can easily be detected.

(6) Because of the displays referred to in (4), the work load and the time required to prepare one pattern can be made known.

(7) The installation of the group of display lamps makes it possible to detect any portion in error at a glance.

(8) The contents of operation set by the display lamps can readily be confirmed.

(9) Whether or not the operational order is normal can be detected according to the display lamps.

(10) Due to the previously described advantages (3) through (9), the operability of the apparatus becomes improvable.

Although a specific description has been given of the present invention by reference to an embodiment, the present invention is not limited by any of the details of description, unless otherwise specified, but rather be construed broadly within its spirit and scope as set out in the accompanying claims.

For instance, since the various means thus provided according to the present invention are capable of moving the hand member using at least one of the hand member, the arm, the arm support member and the support, the operation is alterable in various manners.

As set forth above, the following effects are achievable according to the present invention:

(1) The operator is required only to mount a group of films as originals onto the pallet stocker and press the start switch for instructing operation and the robot is automatically operated so as to effect the operation without other types of mechanical operation, whereby the whole pattern printing step can be completely automated.

(2) The mark for identifying the kinds of films and the contents of operation is attached to each film and the hand member of the robot is equipped with the data detection sensor, which is so operated as to supply the data to the controlling device, so that various kinds of operation are automatically performed.

(3) The installation of the operational order setting means makes it possible to change the operational order easily at any time by turning on the press button.

(4) The installation of the displays for displaying the operational order and the error message also makes it possible to confirm the operation order at a glance.

(5) Because of the displays referred to in the above paragraph, any portion in trouble can easily be detected.

(6) Because of the displays referred to in the second above paragraph, the work load and the time required to prepare one pattern can be made known.

(7) The installation of the group of display lamps makes it possible to detect any portion in error at a glance.

(8) The contents of operation set by display lamps can readily be confirmed.

(9) Whether or not the operational order is normal can be detected according to the display lamps.

(10) Due to the aforesaid effects (3) through (9), the operability of the apparatus is improved.

What is claimed is:

1. A display unit for controlling pattern printing, comprising:
   a plurality of films for printing a pattern;
   an identification mark attached to each of said films and used to identify the contents of a pattern printing operation;
   a data detection sensor for detecting said identification marks;
   a controlling device for controlling the operational order of steps in said pattern printing operation by means of the output of said sensor;
   operational order setting means for variably setting, changing and displaying said operational order of said controlling device; and
   means for displaying at least either the results of said pattern printing operation or an error message.

2. A display unit for controlling pattern printing comprising:
   a plurality of films for printing a pattern;
   an identification mark attached to each of said films and used to identify the contents of a pattern printing operation;
   a data detection sensor for detecting said identification marks;
   a controlling device for controlling the operational order of steps in said pattern printing operation by means of the output of said sensor;
   operational order setting means for variably setting, changing and displaying said operational order of said controlling device; and
   a group of display lamps for displaying the contents of each type of operation set by said operational order setting means and read from the data represented by said identification marks used to identify the contents of said pattern printing operation.

3. A display unit for controlling pattern printing, comprising:
   a plurality of films for printing a pattern;
   an identification mark attached to each of said films and used to identify the contents of a pattern printing operation;
   a data detection sensor for detecting said identification marks;
   a controlling device for controlling the operational order of steps in said pattern printing operation by means of the output of said sensor;
   operational order setting means for variably setting, changing and displaying said operational order of said controlling device;
   means for displaying at least either the results of said pattern printing operation or an error message; and
   a group of display lamps for displaying the contents of each type of operation set by said operational order setting means and read from the data represented by said identification marks used to identify the contents of said pattern printing operation.

4. A pattern printing apparatus comprising:
   a support installed on a stand;
   an arm support member;
   an arm coupled to said arm support member;
   a hand member fitted to said arm;
   a data detection sensor for detecting data of each mark for identifying the contents of operations assigned to said hand member;
   a pattern printing robot equipped with a controlling device for controlling the operational order of steps in pattern printing operation by means of the output of said sensor;
   a plurality of films for printing a pattern;
   an identification mark attached to each of said films and used to identify the kinds of said films and the contents of a pattern printing operation;
   operational order setting means for variably setting, changing and displaying said operational order of said controlling device;
   means for displaying at least either the results of said pattern printing operation or an error message; and
   a group of display lamps for displaying the contents of each type of operation set by said operational order setting means and read from the data represented by said identification marks used to identify the contents of said pattern printing operation.

5. A display unit as recited in claim 1, further comprising means for detecting a conflict between the setting of said operational order setting means and the information detected from said identification mark, with said means for displaying indicating a detected conflict.

6. A display unit as recited in claim 1, further comprising means for detecting an error in the information detected by said data detection sensor, with said means for displaying indicating a detected conflict.

7. A display unit as recited in claim 2, further comprising means for detecting a conflict between the setting of said operational order setting means and the information detected from said identification mark, with said means for displaying indicating a detected conflict.

8. A display unit as recited in claim 2, further comprising means for detecting an error in the information detected by said data detection sensor, with said means for displaying indicating a detected conflict.

9. A display unit as recited in claim 3, further comprising means for detecting a conflict between the setting of said operational order setting means and the information detected from said identification mark, with said means for displaying indicating a detected conflict.

10. A display unit as recited in claim 3, further comprising means for detecting an error in the information detected by said data detection sensor, with said means for displaying indicating a detected conflict.

11. A display unit as recited in claim 4, further comprising means for detecting a conflict between the setting of said operational order setting means and the information detected from said identification mark, with said means for displaying indicating a detected conflict.

12. A display unit as recited in claim 4, further comprising means for detecting an error in the information detected by said data detection sensor, with said means for displaying indicating a detected conflict.

* * * * *